United States Patent [19]
McHugh et al.

[11] Patent Number: 6,099,321
[45] Date of Patent: Aug. 8, 2000

[54] LOW PROFILE ZERO INSERTION FORCE SOCKET

[75] Inventors: Robert G. McHugh, Evergreen, Colo.; Nick Lin, Hsin-Chuang; Robert Yang, Tu-Chen, both of Taiwan

[73] Assignee: Hon Hai Precision Ind. Co., Ltd., Taipei Hsien, Taiwan

[21] Appl. No.: 09/146,998

[22] Filed: Sep. 4, 1998

[51] Int. Cl.⁷ ................................................. H01R 4/50
[52] U.S. Cl. ............................................................ 437/342
[58] Field of Search ................................... 439/342, 259, 439/856, 857

[56] References Cited

U.S. PATENT DOCUMENTS 5,044,973  9/1991  Noda et al. ............................... 439/296
5,616,044  4/1997  Tsai ......................................... 439/342

*Primary Examiner*—Steven L. Stephan
*Assistant Examiner*—Eugene G. Byrd

[57] ABSTRACT

A zero insertion force socket for connecting a CPU to a printed circuit board consists of a dielectric base receiving a number of contacts therein, and a cover movably mounted on the base between a closed position and an open position. At the open position, pins of the CPU extending through the cover into the base are each received in a space defined within an arc section of the corresponding contact. At the closed position, each pin is moved to be clamped between fixed and movable contacting sections of the corresponding contact. The movable contacting section connects with the fixed contacting section via the arc section providing the clamping force. Each fixed contacting section connects with a tail portion located therebelow for being soldered to the printed circuit board.

28 Claims, 15 Drawing Sheets

LOW PROFILE ZERO INSERTION FORCE SOCKET

BACKGROUND OF THE INVENTION

1. Field of the Invention

The present invention relates to a zero insertion force (ZIF) socket which has a low profile and improved contacts for reliably and effectively connecting pins of a CPU to a printed circuit board on which the socket is mounted.

2. The Prior Art

ZIF sockets conveniently connect a CPU with a large number of pins to a printed circuit board without the necessity of exerting a large force to insert the CPU into the socket. The ZIF socket has a cover which is movable relative to a base, thereby displacing the pins of the CPU to engage with/disengage from contacts of the ZIF socket which are fixedly received in the base and soldered to the printed circuit board.

ZIF sockets were originally provided with actuation mechanisms (usually consisting of a lever and a cam) to displace the cover relative to the base. Such sockets are disclosed in U.S. Pat. Nos. 5,057,031 and 5,489,217.

Following the development of laptop computers which require a relatively small thickness, a low profile ZIF socket has been proposed which eliminates the actuation mechanism. A separate tool (for example, a flat screw driver) is used to actuate the cover relative to the base. Such a socket is disclosed in U.S. Pat. No. 5,730,615 ('615 patent) to Lai et al. which is assigned to the same assignee as the present application.

Although the '615 patent has proven to work well, disadvantages exist which need to be addressed.

Firstly, due to each contact 16 of the '615 patent having a substantially straight configuration, a counteractive force acting on the contact when the corresponding pin of the CPU is moved to engage therewith is resisted only by a small area of the contact, which causes the contact to be subject to a relatively high amount of stress, thus, the contact becomes easily fatigued.

Secondly, the profile of the socket in accordance with the '615 patent is still too high to meet the requirement of laptop computers which are designed to be increasingly thinner.

Hence, an improved ZIF socket is needed to eliminate the above mentioned defects of the '615 patent.

SUMMARY OF THE INVENTION

Accordingly, an objective of the present invention is to provide a ZIF socket having improved contacts which can reliably and effectively connect pins of a CPU to a printed circuit board on which the socket is mounted.

Another objective of the present invention is to provide a ZIF socket having a reduced profile.

To fulfill the above mentioned objectives, according to one embodiment of the present invention, a rectangular zero insertion force socket for connecting a CPU to a printed circuit board includes a base defining a number of contact passageways, a number of contacts fixedly received in the contact passageways, and a cover defining a number of holes and movably mounted on the base between a closed position and an open position. Pins of the CPU extend through the holes of the cover and into the contact passageways of the base.

At the open position each pin extends through a space defined by an arc section of the corresponding contact. At the closed position, each pin is clamped between fixed and movable contacting sections of the corresponding contact, wherein the movable contacting section connects with the fixed contacting section via the arc section. The fixed and movable contacting sections and the arc section are located at the same level so that the contact can have a relatively small height, thereby enabling the socket to have a further reduced profile. The fixed contacting section connects with a tail portion located therebelow which is soldered to the printed circuit board to electrically connect the corresponding pin thereto, whereby the pin can electrically connect with the printed circuit via a relatively short path.

The base forms teeth on inclined faces of lateral sides thereof which extend in a direction parallel to a diagonal direction of the socket. The teeth extend into corresponding rectangular slots defined from a top face of the cover into protrusions on a bottom face of the cover and are supported by guiding rails extending from a bottom of the slots, respectively. The slots are exposed to sides of the protrusions extending in a direction parallel to the diagonal direction of the socket. Each tooth has an end edge engaging with an inner face of the corresponding slot, whereby the cover is moved relative to the base between the open and closed positions along the diagonal direction.

DETAILED DESCRIPTION OF THE PREFERRED EMBODIMENT

Reference will now be made in detail to the preferred embodiments of the present invention.

Figure 1:
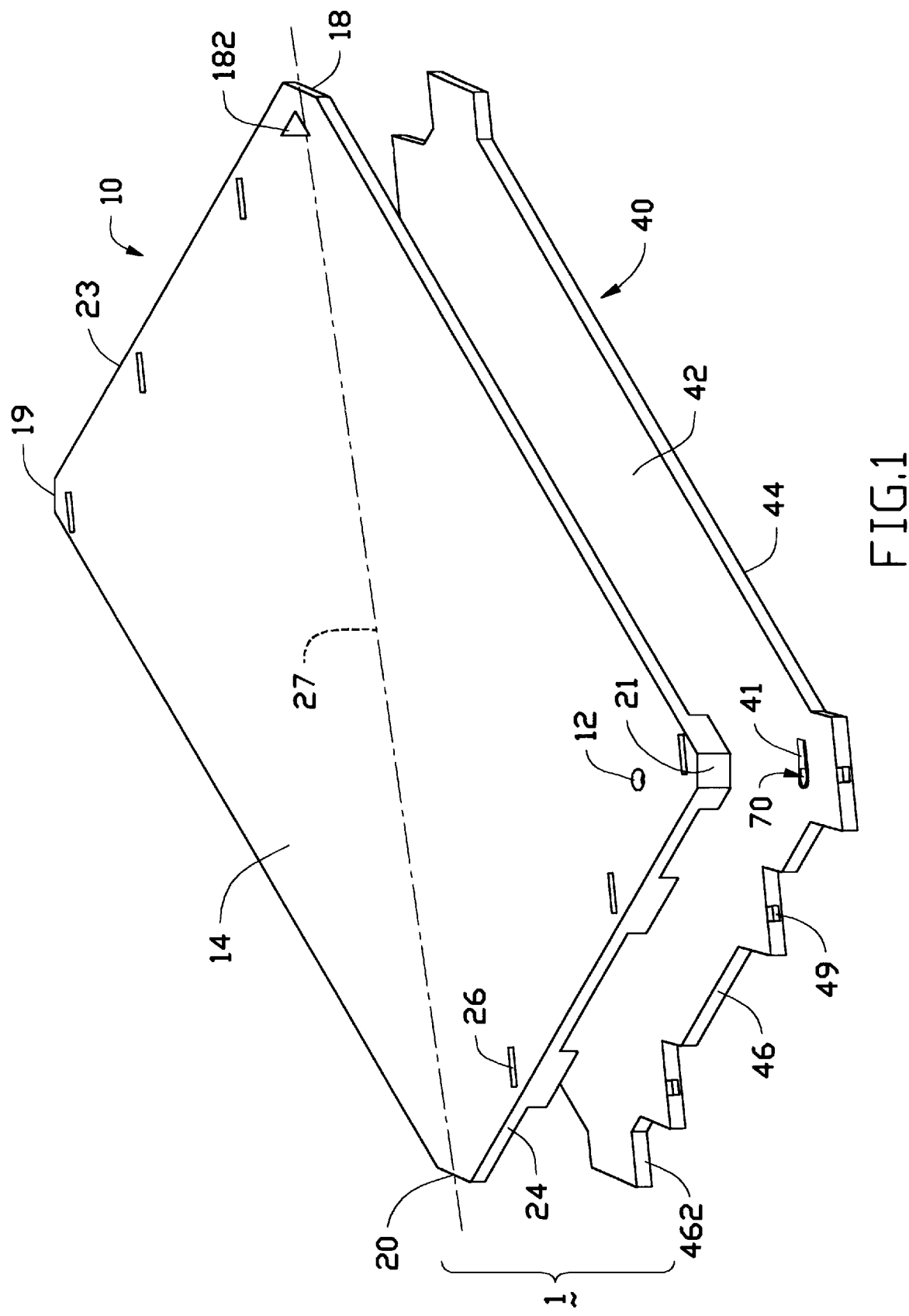
FIG. 1 is an exploded, perspective view of a ZIF socket in accordance with the present invention.
Figure 2:
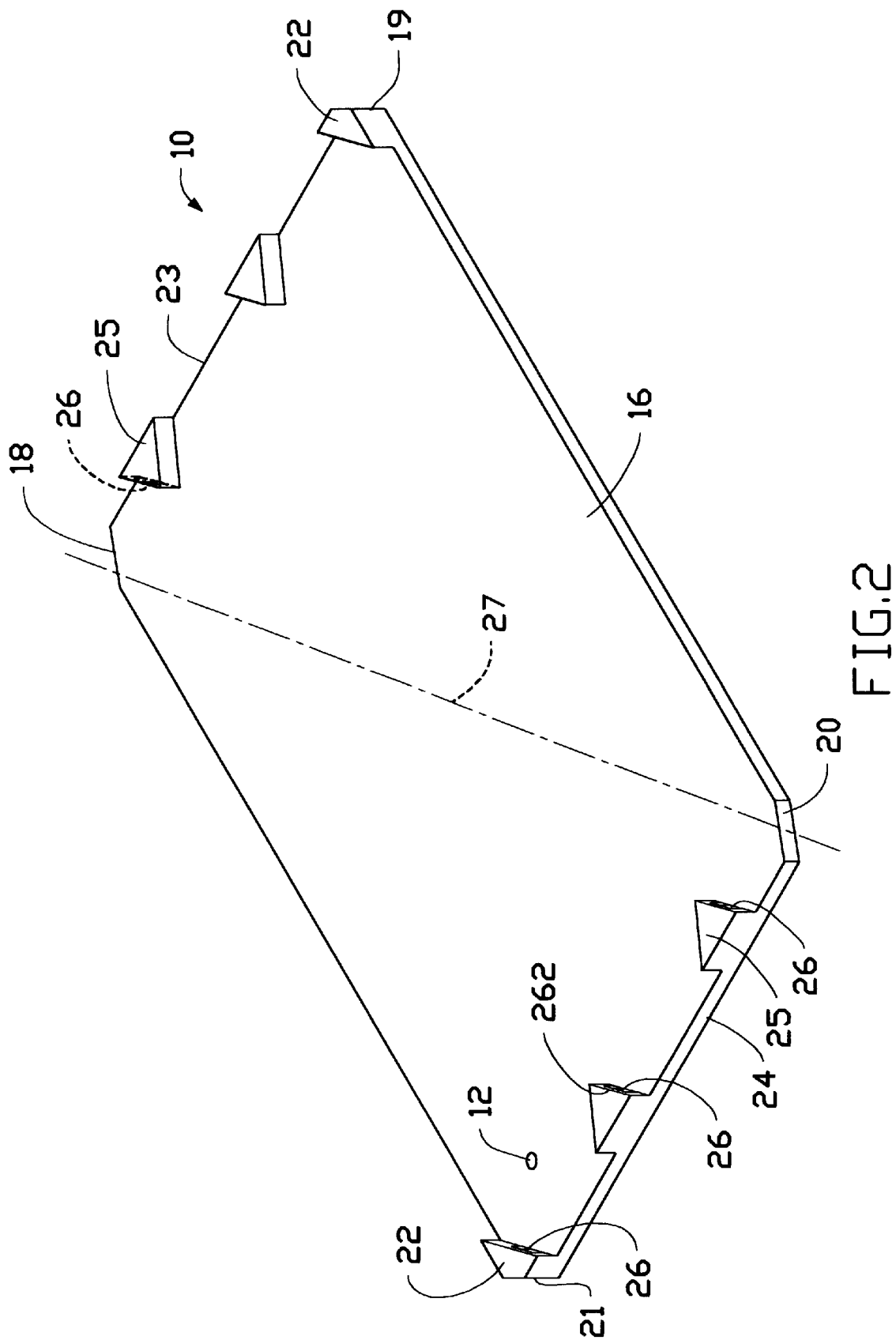
FIG. 2 is a perspective view of a cover of the ZIF socket of FIG. 1 as viewed from a different direction.
Figure 8:
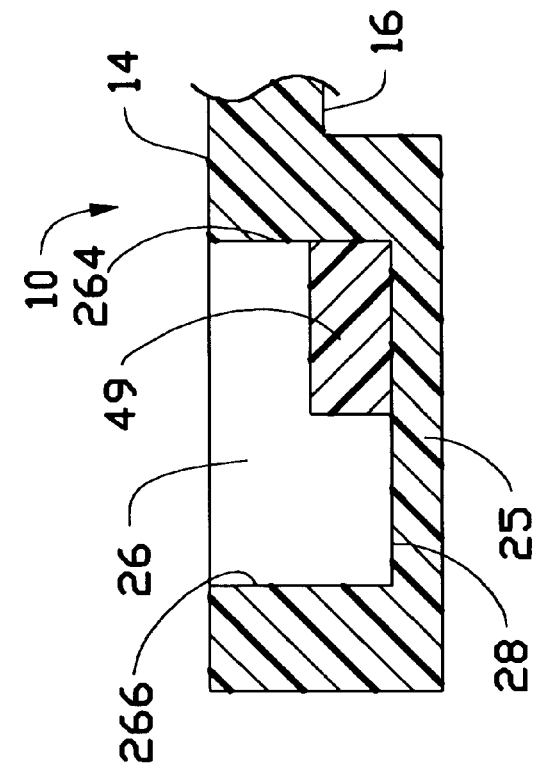
FIG. 8 is a plain cross-sectional view taken along line 8—8 of FIG. 6.
Figure 7:
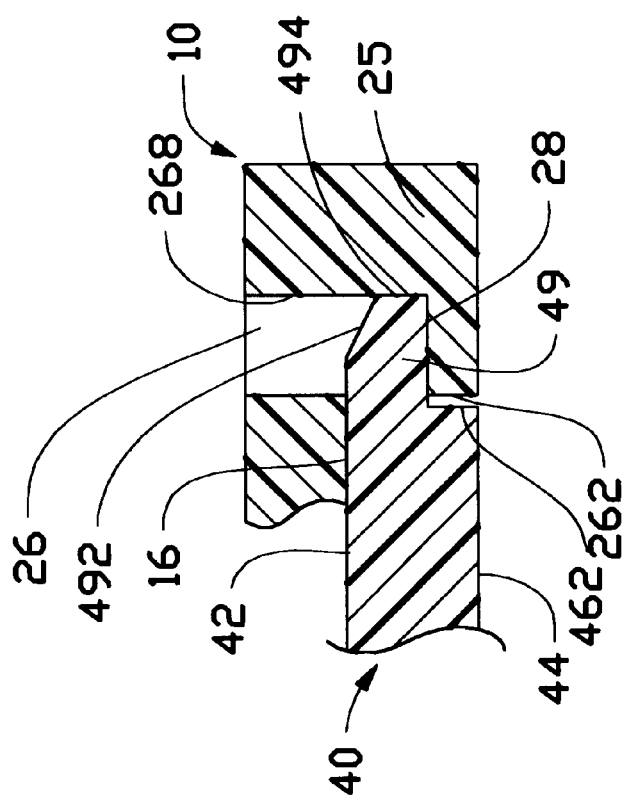
FIG. 7 is a plain cross-sectional view taken along line 7—7 of FIG. 6.
Figure 9:
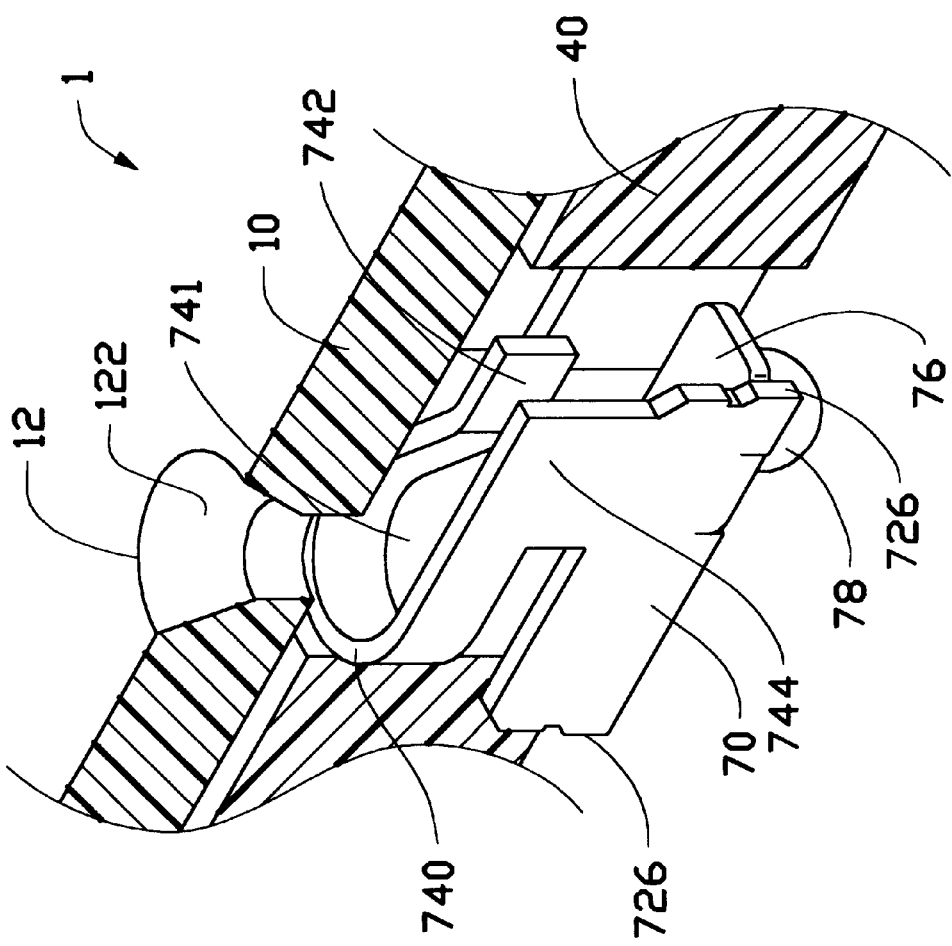
FIG. 9 is a perspective cross-sectional view taken along line 9—9 of FIG. 6.

As shown in FIGS. 1 and 2, a ZIF socket 1 in accordance with the present invention consists of a cover 10, a base 40 and a number of conductive contacts 70. The cover 10 has a substantially rectangular shape defining a number of holes 12 (only one shown) through top and bottom faces 14, 16 thereof for insertion of pins of a CPU (not shown) into the socket 1. As best seen in FIG. 9, each hole 12 has an enlarged upper portion 122 for guiding the insertion of the pins into the socket 1. The cover 10 has four slanted corners 18, 19, 20, 21 wherein an indicating triangle 182 is formed on the top face 14 near the corner 18 indicating the direction for moving the cover 10 relative to the base 40 to a closed position where the pins are clamped by the contacts 70, which will be explained in detail below. Two trapezoidal blocks 22 are formed on the bottom face 16 at the corners 19, 21. Two triangular blocks 25 are formed on the bottom face 16 near each lateral side 23, 24 of the cover 10. Each block 22, 25 defines a rectangular slot 26 therein and through the top face 14 of the cover 10. The slot 26 is exposed to a side 262 of each of the corresponding blocks 22, 25. The side 262 of each block 22, 25 is parallel to a diagonal 27 of the socket 1 extending from the corner 18 to the opposite corner 20. A guiding rail 28 extends into each slot 26 at a bottom thereof (best seen in FIGS. 7 and 8).

Figure 3:
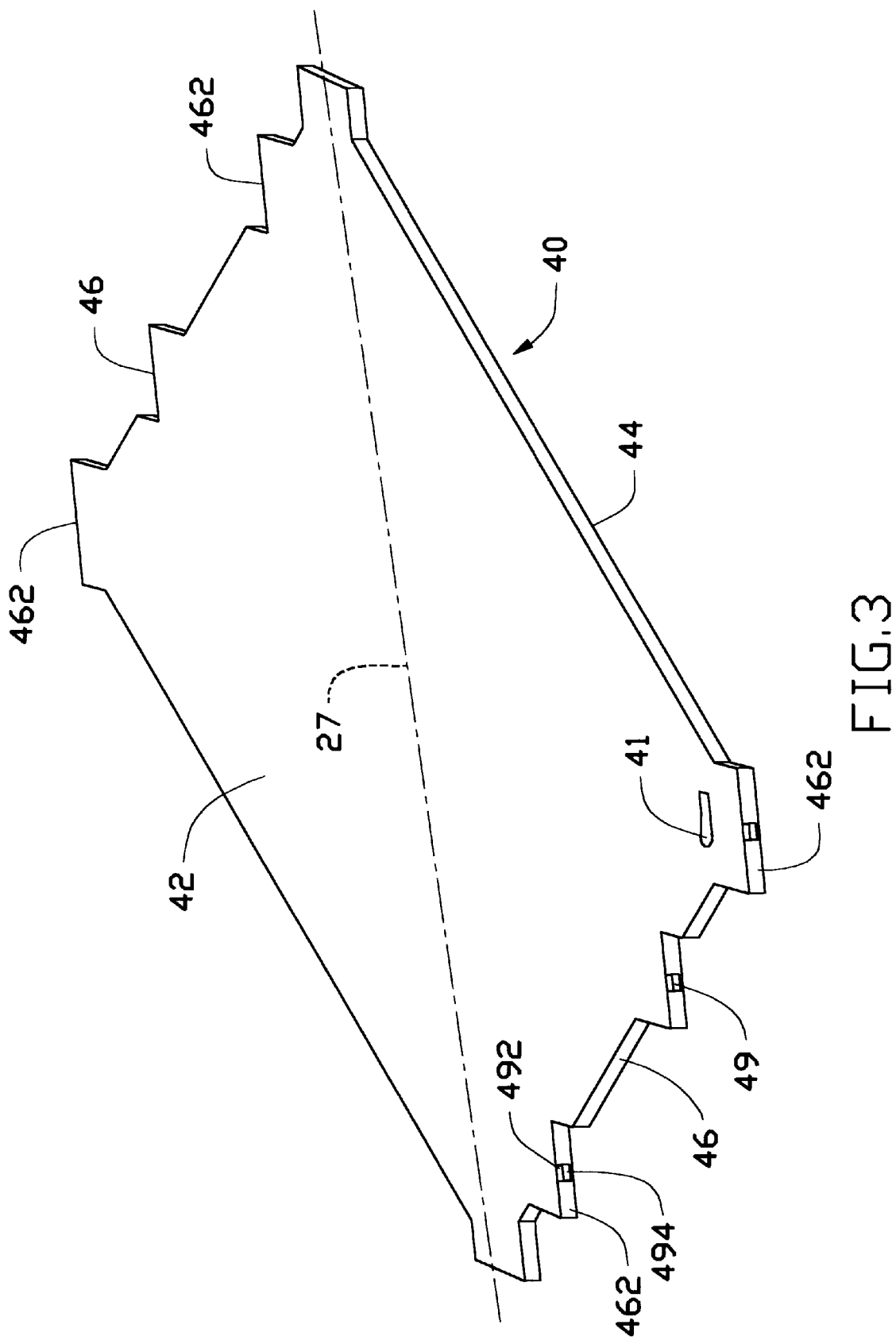
FIG. 3 is a perspective view of a base of the ZIF socket of FIG. 1.

Also referring to FIG. 3, the base 40 also has a substantially rectangular shape defining a number of contact passageways 41 (only one shown) extending through upper and lower faces 42, 44 thereof. Two lateral sides 46 of the base 40 each form three inclined sections 462 parallel to the diagonal 27. Each inclined section 462 forms a tooth 49 projecting therefrom. The tooth 49 has an inclined upper face 492 for facilitating the mounting of the tooth 49 into the corresponding slot 26, and a vertical end edge 494 (best seen in FIG. 7).

Figure 4:
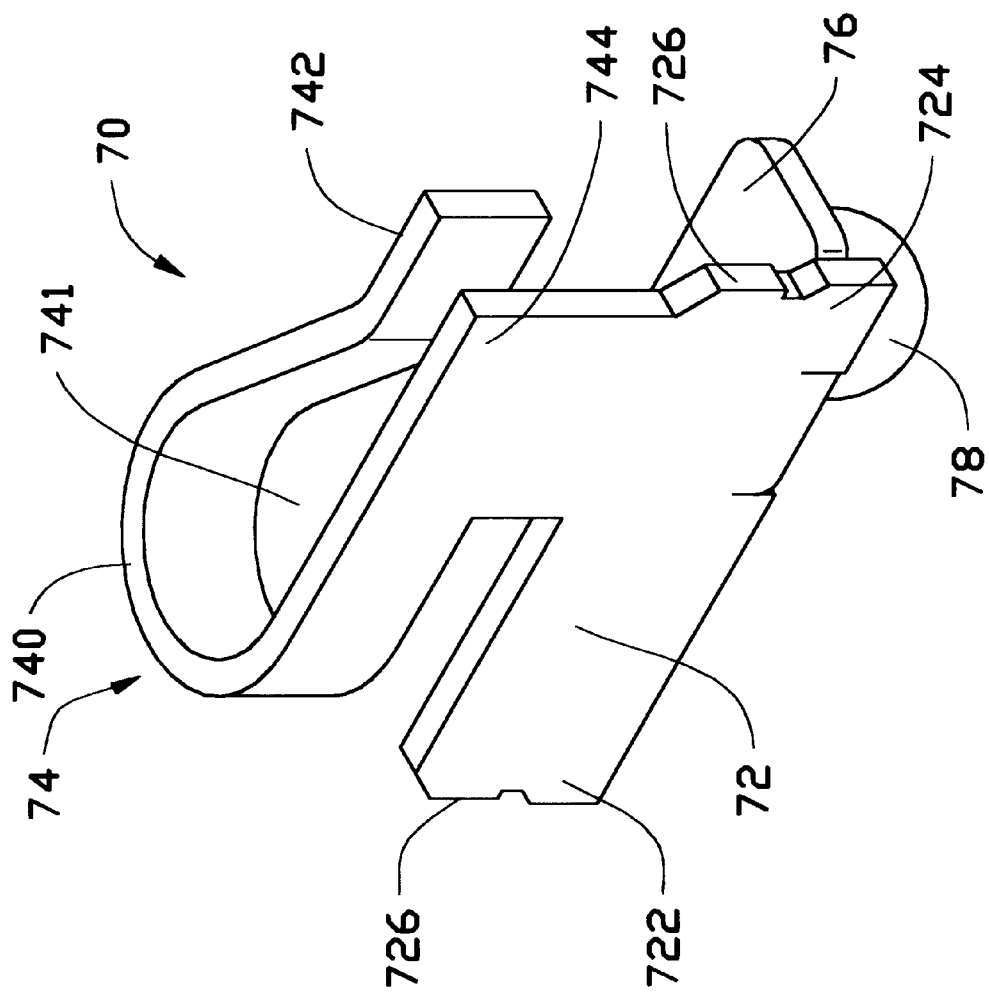
FIG. 4 is an enlarged perspective view of a contact of the ZIF socket of FIG. 1.
Figure 5:
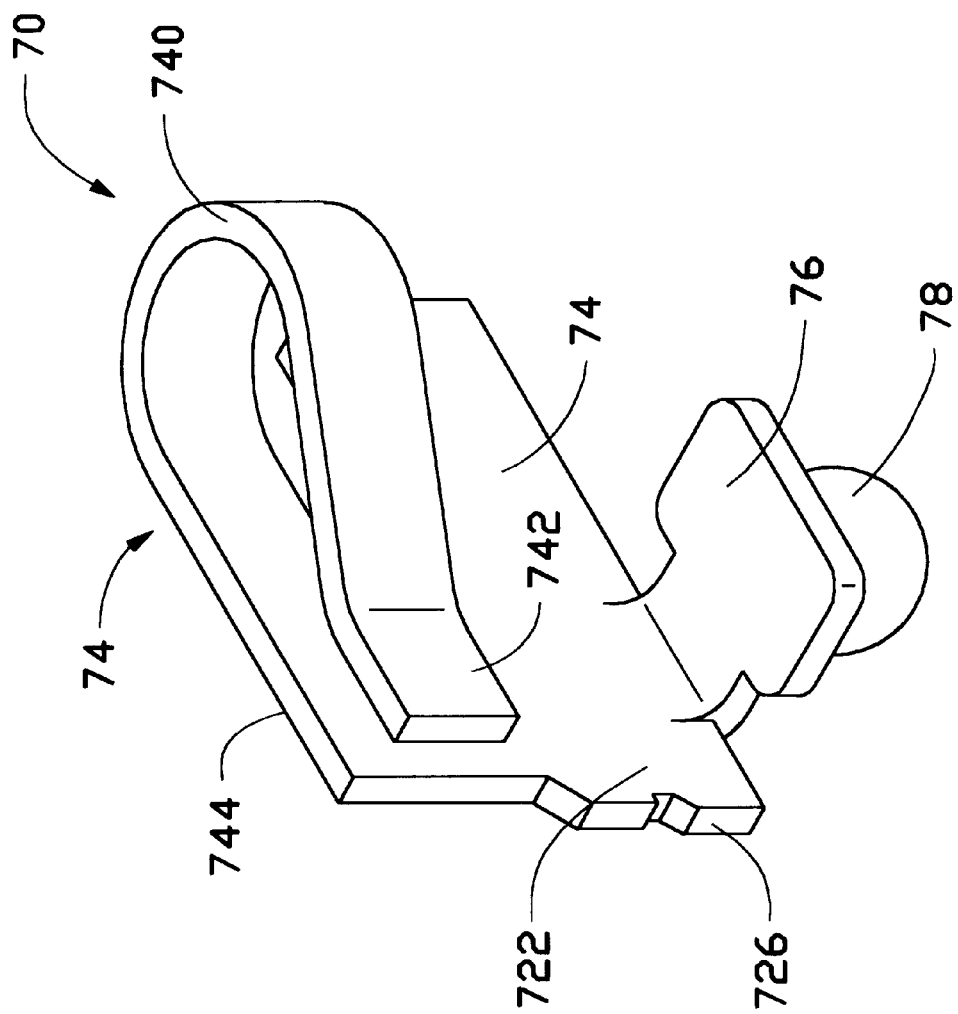
FIG. 5 is the contact of FIG. 4 as viewed from a different direction.

Referring to FIGS. 4 and 5, each conductive contact 70 is formed by stamping a metal sheet to have an elongate plate-like fitting portion 72 defining two barbs 726 projecting from each of first and second lateral sides 722, 724 thereof which interferentially engage with the base 40 when the contact 70 is mounted in the corresponding contact passageway 41. A contact portion 74 is formed above the fitting portion 72 which has a fixed contacting section 744 just above the fitting portion 72 near the second lateral side 724 thereof, an arc section 740 extending from the fixed contacting section 744 firstly toward the first lateral side 722 and then back toward the second lateral side 724 to define a free end functioning as a movable contacting section 742 which is spaced from the fixed contact section 744 a distance. The arc section 740 and the movable and fixed contacting sections 742, 744 are located at the same level whereby the contact 70 has a relatively small height to enable the socket 1 to have a reduced profile. The arc section 740 functions to afford a spring force (normal force) for the fixed and movable contacting sections 744, 742 of the contact 70 to clamp the corresponding pin of the CPU inserted into the socket 1. The arc section 740 defines a pin receiving space 741 therein. A tail portion 76 perpendicularly extends from a lower edge of the fitting portion 72 near the second lateral side 724 to be below the fixed and movable contacting sections 744, 742. The contact 70 shown herein is a ball-grid-array (BGA) type contact which, after being mounted to the socket 1, is subject to a BGA package processing to be attached with a solder ball 78 at a bottom thereof. The ball 78 is soldered to electrically and mechanically connect the socket 1 to a printed circuit board (not shown) on which the socket 1 is mounted when the socket 1 and the PCB are together subject to a reflow process.

Figure 16:
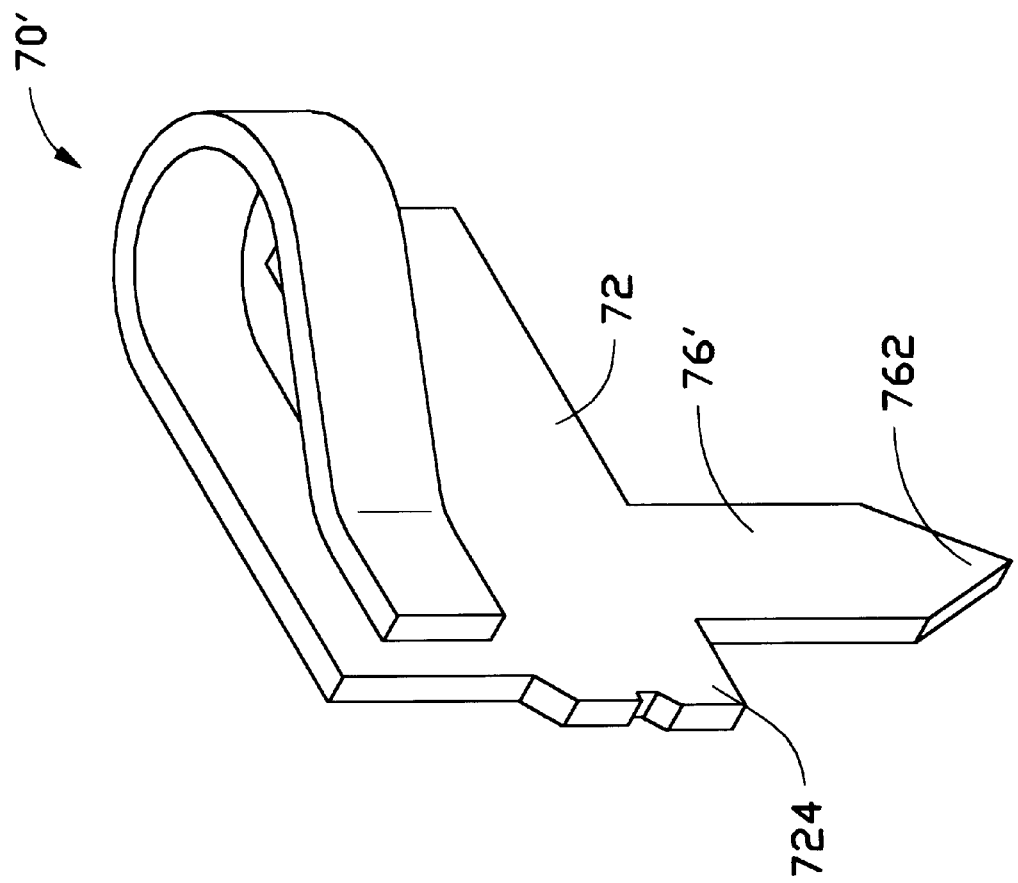
FIG. 16 is a perspective view showing a second embodiment of the contact of the ZIF socket in accordance with the present invention.

FIG. 16 shows a contact 70' in accordance with a second embodiment of the present invention which is a through-hole type contact having a tail portion 76' with a pointed bottom end 762 projecting downward from the lower edge of the fitting portion 72 near the second lateral side 724. The tail portion 76' is directly inserted through a corresponding hole defined in the printed circuit board and then soldered thereto.

Figure 6:
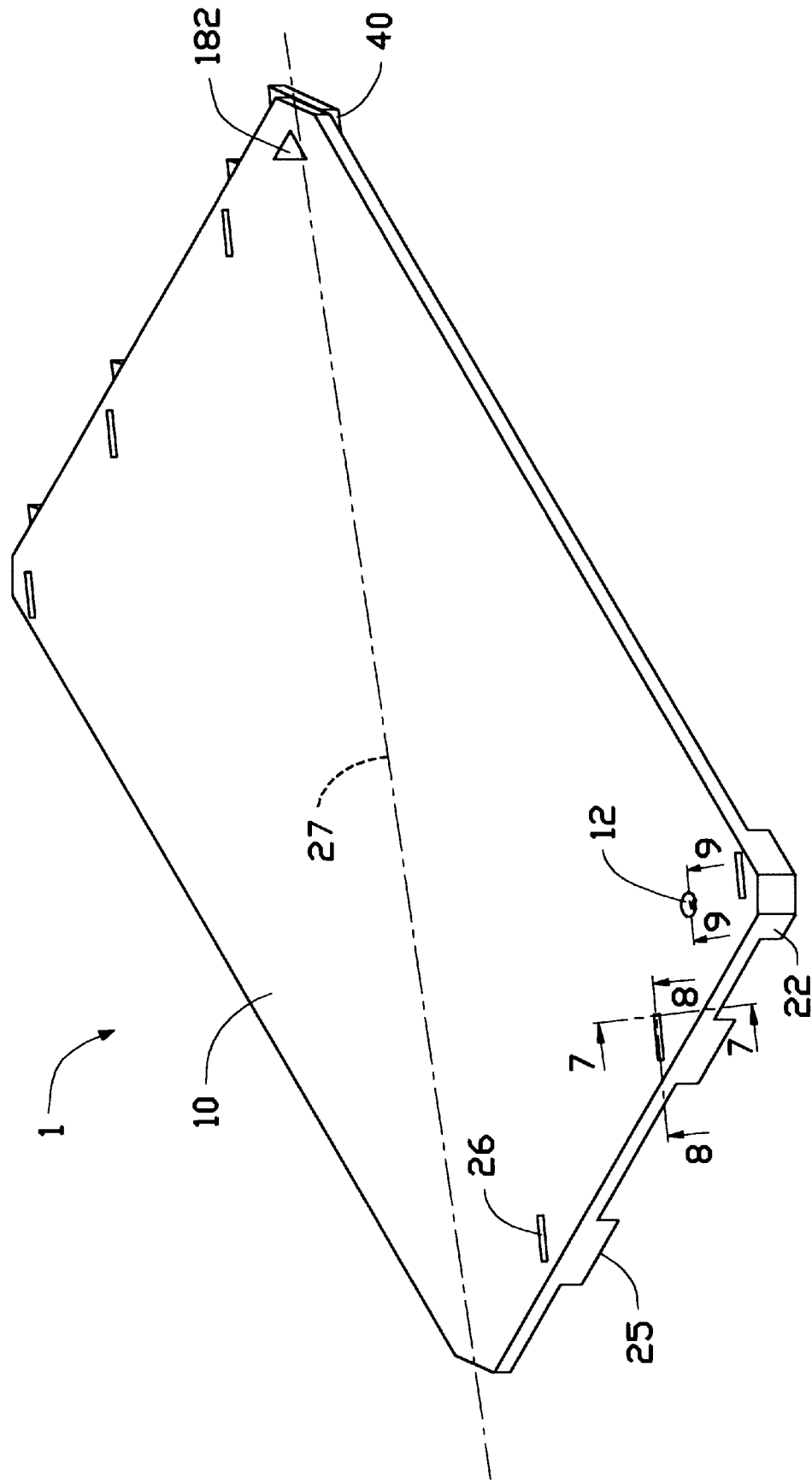
FIG. 6 is the assembled ZIF socket of FIG. 1 wherein the cover is at an open position.

To assemble the ZIF socket 1 in accordance with the present invention, referring to FIGS. 1 and 6 to 9, the conductive contacts 70 are fitted into the corresponding contact passageways 41 of the base 40 (FIG. 1). Thereafter, the cover 10 is pressed onto the base 40 to reach a position, best seen in FIG. 7, where the teeth 49 of the base 40 extend into the corresponding slots 26 of the trapezoidal and triangular protrusions 22, 25 on the bottom 16 of the cover 10 and are supported on the rails 28. The upper inclined face 492 is formed to facilitate the engagement of the cover 10 with the base 40. The vertical end edge 494 of each tooth 49 engages with an outer face 268 of the corresponding slot 26. FIG. 6 shows the socket 1 at an open position where each tooth 49 engages with a rear edge 264 of the corresponding slot 26 (FIG. 8), and each hole 12 is aligned with the pin-receiving space 741 defined by the arc section 740 of the corresponding contact 70 (FIG. 9).

Figure 13:
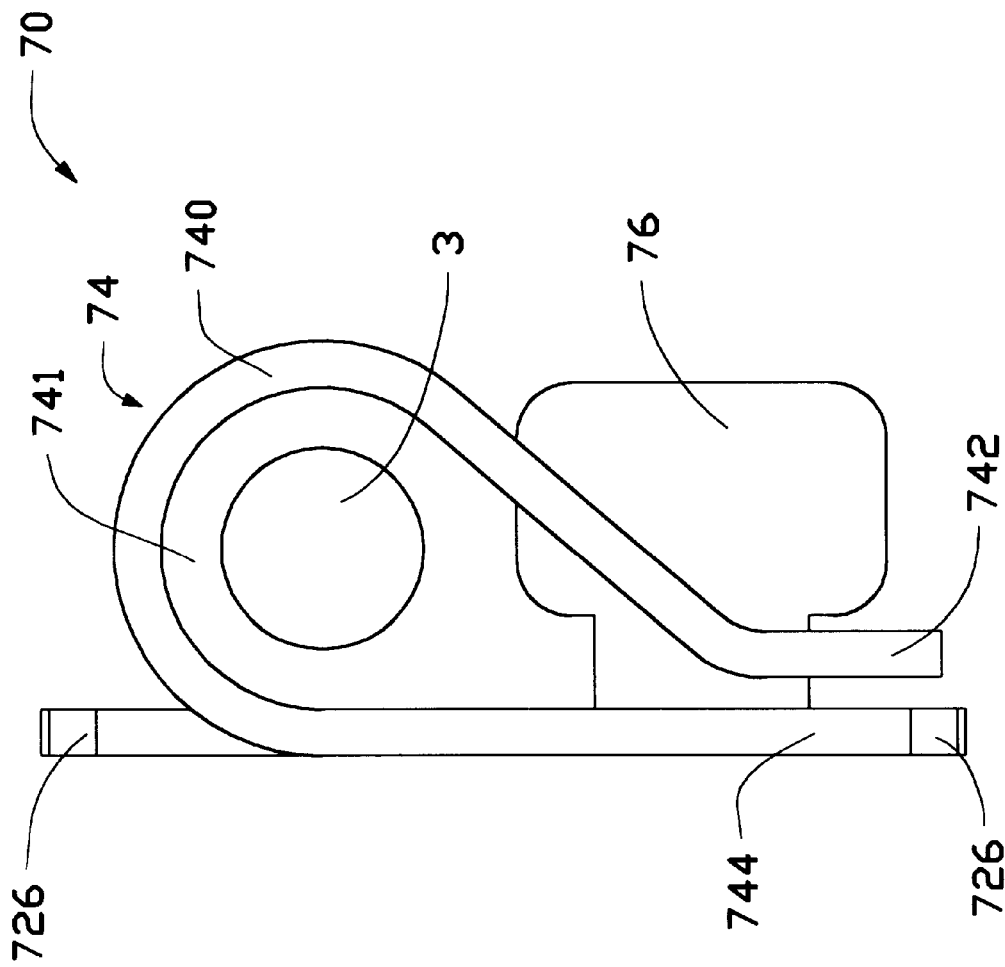
FIG. 13 is a diagrammatic view showing a relation between a contact of the socket and a pin of a CPU mounted on the socket when the cover is at the open position.

At this position, referring to FIG. 13, a pin 3 of a CPU extending into the socket 1 via the corresponding hole 12 in the cover 10 is received in the pin receiving space 741 and does not make contact with the contact 70.

Figure 10:
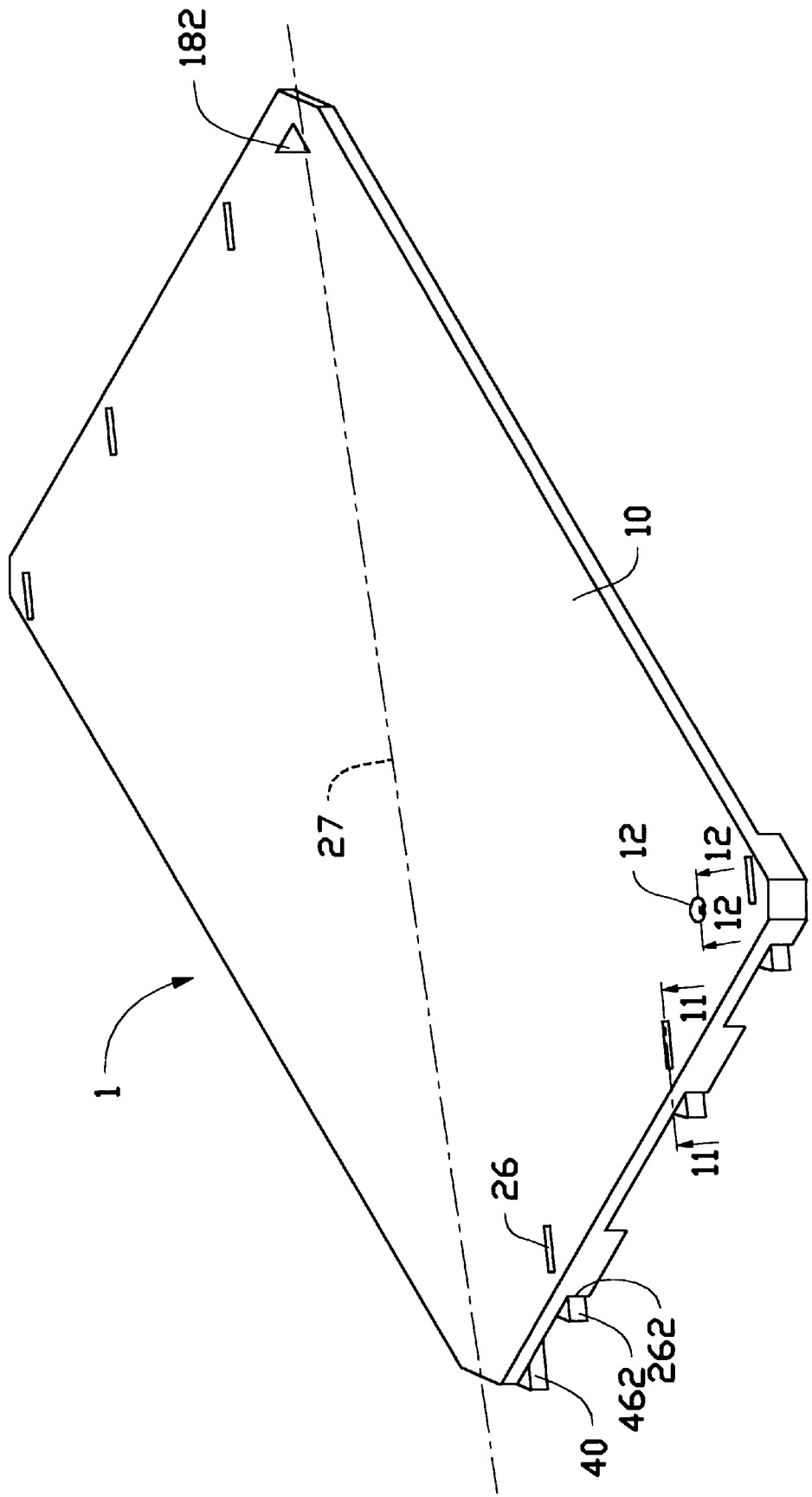
FIG. 10 is the assembled ZIF socket wherein the cover is at a closed position.
Figure 11:
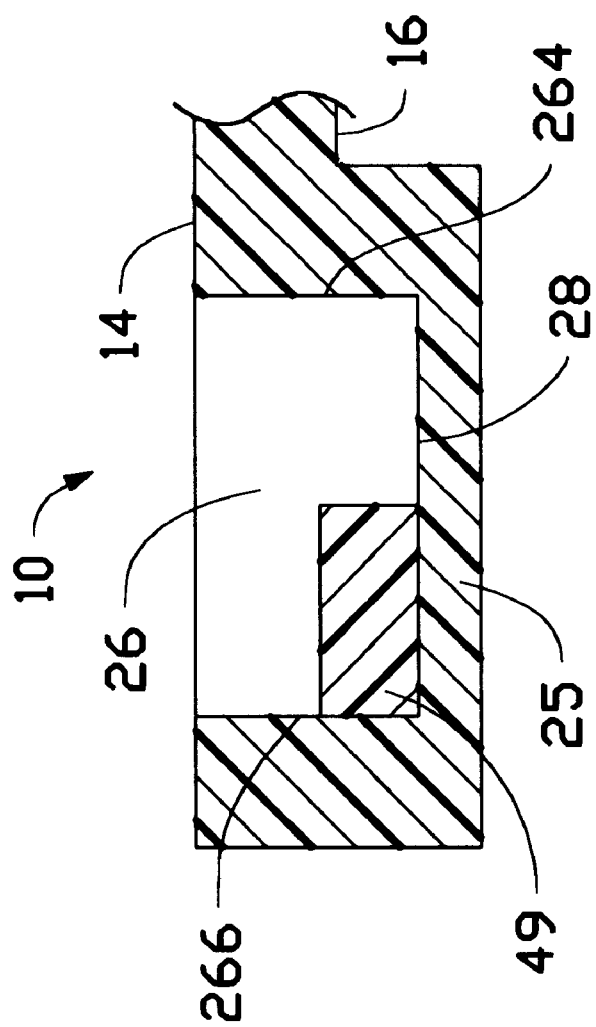
FIG. 11 is a plain cross-sectional view taken along line 11—11 of FIG. 10.
Figure 12:
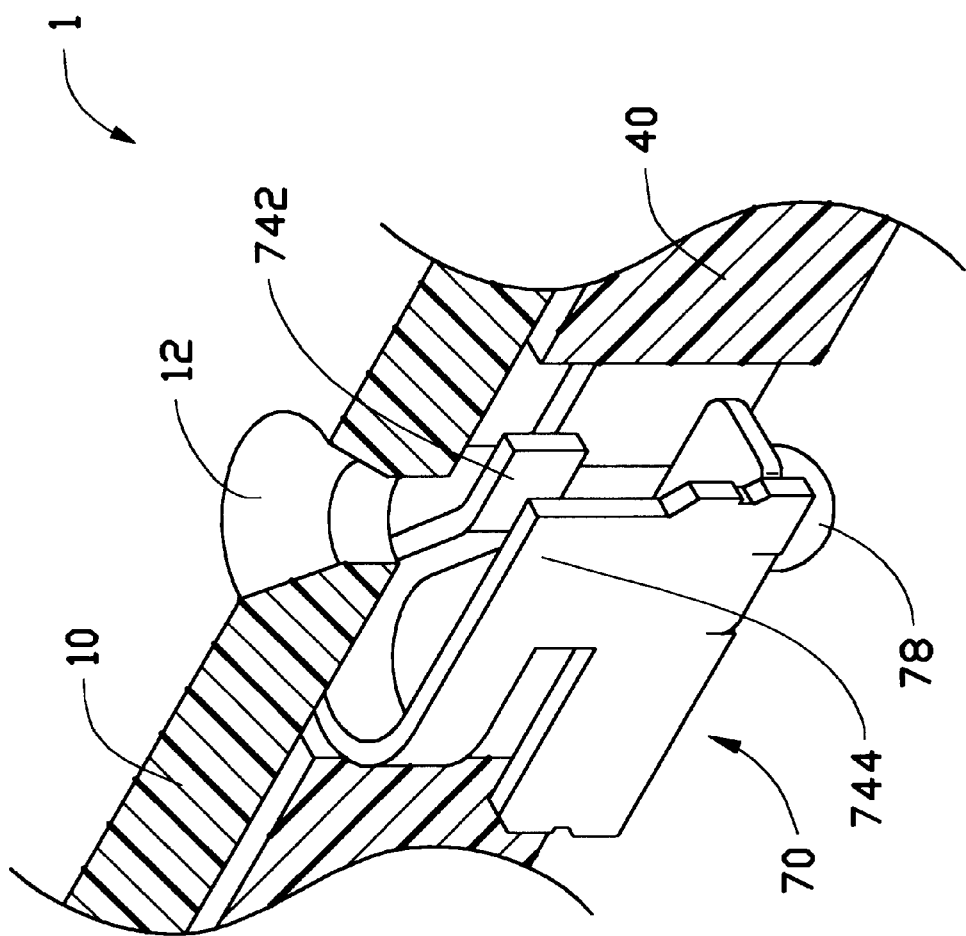
FIG. 12 is a perspective cross-sectional view taken along line 12—12 of FIG. 10.

FIG. 10 shows the socket 1 after moving from the open position to a closed position by pushing the cover 10 relative to the base 40 in a direction indicated by the indicating triangle 182 to a position where each tooth 49 moves along the corresponding rail 28 to engage with a front edge 266 of the corresponding slot 26 (FIG. 11), and each hole 12 is aligned with a space between the fixed and movable contacting sections 744, 742 (FIG. 12).

Figure 14:
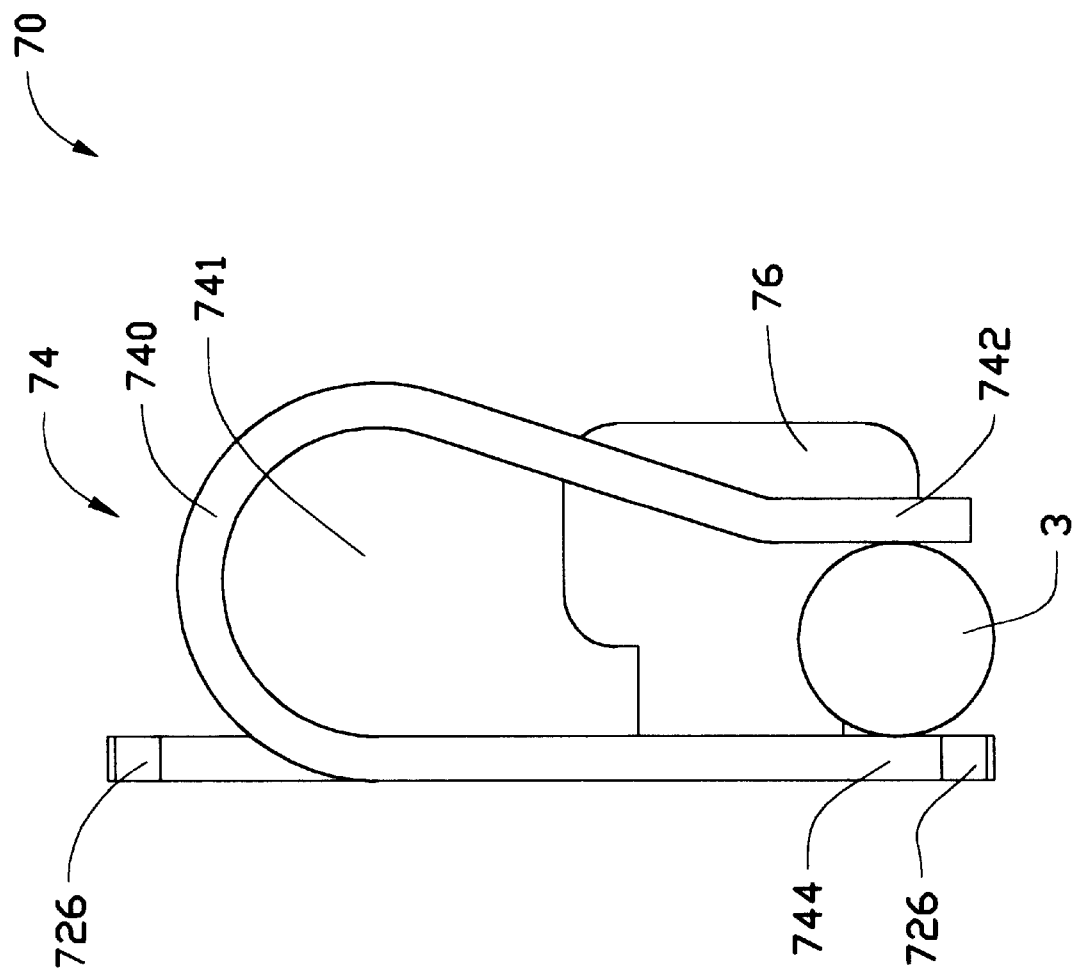
FIG. 14 is a diagrammatic view showing a relation between the contact and the pin when the cover is at the closed position.

When the socket 1 is moved from the open position to the closed position, the pin 3 is moved from the pin receiving space 741 as shown in FIG. 13 to the position as shown in FIG. 14 where the movable contacting section 742 exerts a normal force obtained from the arc section 740 on the pin 3 to clamp it to the fixed contacting section 744 whereby the pin 3 is electrically and mechanically connected with the fixed contacting section 744.

In the present invention, as a counteractive force of the normal force acting on the movable contacting section 742 by the pin 3 is resisted by a relatively long length (which means a relatively large area) of the contact 70 including the movable contacting section 742 and the arc section 740, the high amount of stress which acts on the straight contact of the '615 patent will not happen to the contact 70 of the present invention.

Furthermore, as the pin 3 is engaged with the fixed contacting section 744 which is located directly above the tail portion 76, electrical signals can be transmitted between the pin 3 and the printed circuit board through a relatively short path so that the socket 1 can effectively connect the CPU to the PCB to eliminate signal loss due to a long signal transmission path which is often found in contacts having a configuration intended to reduce the stress acting thereon.

Figure 15:
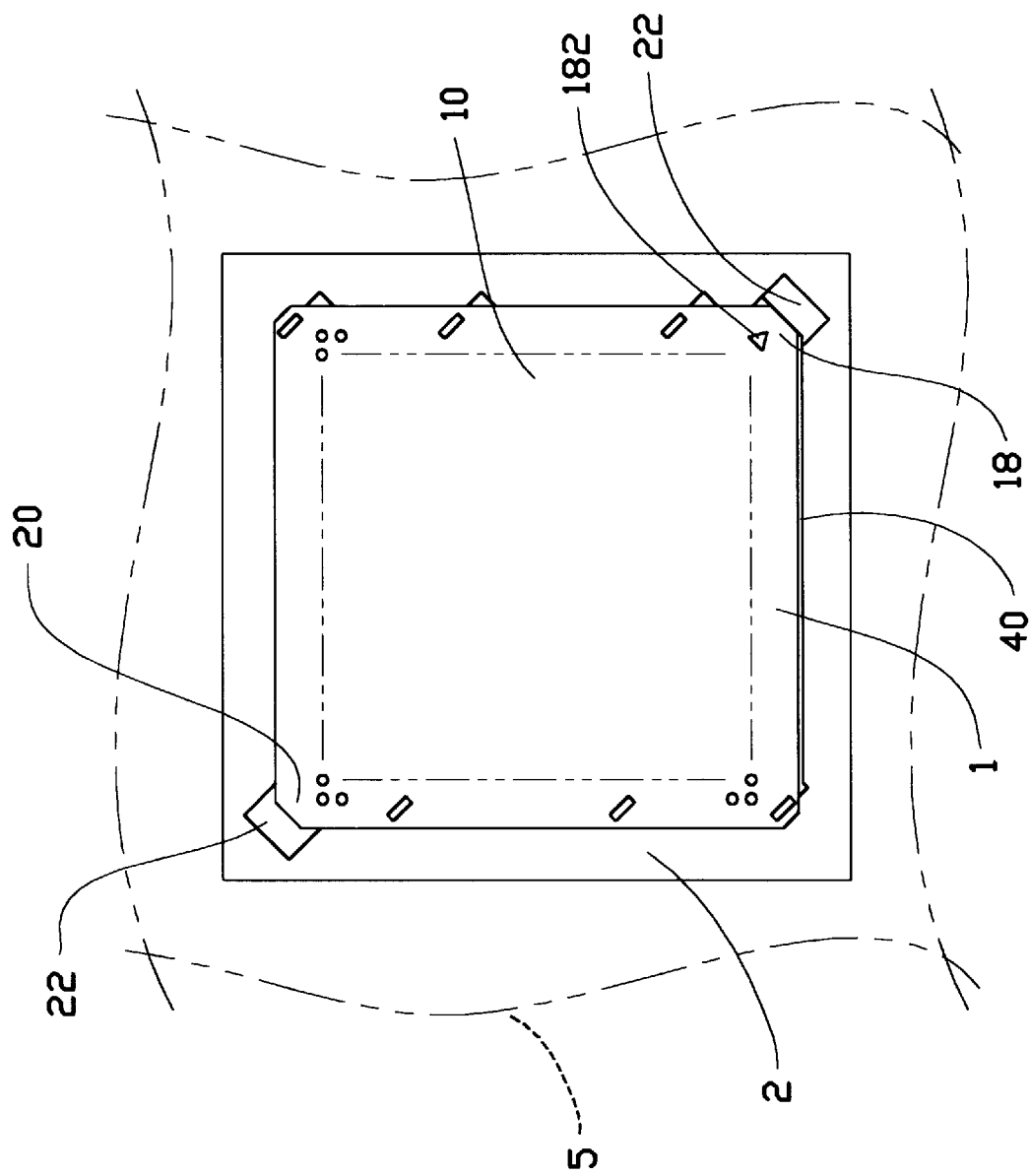
FIG. 15 is a top view showing an application to facilitate displacement of the cover between the open and closed positions.

FIG. 15 shows an application to facilitate the displacement of the cover 10 relative to the base 40. A rectangular frame 2 is mounted on a printed circuit board 5 and the socket 1 mounted on the PCB 5 within the frame 2. The frame 2 defines two rectangular cuts 22 in two opposite inner corners thereof. The two opposite corners 18, 20 of the cover 10, one of which has the indicating triangle 182 formed thereon, are received in the cuts 22. A tool (not shown) is extended into the cuts 22 to displace the cover 10 relative to the base 40. The frame 2 can be used as a base for mounting of a heat sink (not shown) to dissipate heat generated by the CPU mounted on the socket 1.

While the present invention has been described with reference to specific embodiments, the description is illustrative of the invention and is not to be construed as limiting the invention. Various modifications to the present invention can be made to the preferred embodiments by those skilled in the art without departing from the true spirit and scope of the invention as defined by the appended claims.

We claim:

1. A zero insertion force (ZIF) electrical socket for connecting a CPU to a printed circuit board, comprising:
    a dielectric base defining a number of contact passageways therein;
    a number of contacts fixedly received in the contact passageways, each contact having a fitting portion fixedly engaging with the base and defining a first side and an opposite second side, a tail portion below the fitting portion near the second side thereof for being soldered to a printed circuit board, and a contact portion for engaging a pin of a CPU, the contact portion including a fixed contacting section formed directly above the fitting portion near the second side thereof, an arc section extending from the fixed contacting section to a position above the first side of the fitting portion, and a movable contacting section extending from the arc section to a position facing the fixed contacting section and spaced therefrom; and
    a cover movably mounted onto the base between an open position and a closed position and defining a number of holes for extension of the pins of the CPU into the socket, said holes being in alignment with the corresponding contact passageways wherein at the open position each hole is aligned with a space defined within the arc section of the corresponding contact, and at the closed position each hole is aligned with a space defined between the fixed contacting section and the movable contacting section of the corresponding contact.

2. The ZIF socket in accordance with claim 1, wherein the tail portion of each contact is bent perpendicular to the fitting portion and attached with a solder ball on a bottom face thereof.

3. The ZIF socket in accordance with claim 1, wherein the tail portion is straight and extends downward from the fitting portion.

4. The ZIF socket in accordance with claim 1 wherein each hole in the cover has an enlarged upper portion.

5. The ZIF socket in accordance with claim 1, wherein the fitting portion is shaped like an elongate plate having a first lateral side as the first side and a second lateral side as the second side, each lateral side forming a barb interferentially engaging with the base.

6. The ZIF socket in accordance with claim 1, wherein the cover and base have a rectangular shape so that the socket has a rectangular shape, accordingly, and the socket comprises means for guiding the cover to move relative to the base in a diagonal direction between the open and closed positions.

7. The ZIF socket in accordance with claim 6, wherein the guiding means comprises a number of teeth formed on inclined faces of lateral sides of the base extending parallel to the diagonal direction of the socket, and a number of guiding rails respectively formed in protrusions on a bottom face of the cover, each rail extending parallel to the diagonal direction of the socket, each tooth extending into the corresponding protrusion and being supported on the guiding rail.

8. The ZIF socket in accordance with claim 7, wherein the rail extends from a lower portion of a rectangular slot in the corresponding protrusion, at the open position the tooth engaging with a first end of the corresponding slot and at the closed position the tooth engages with an opposite second end thereof.

9. The ZIF socket in accordance with claim 8, wherein each slot communicates with a top face of the cover.

10. The ZIF socket in accordance with claim 6, wherein the cover includes a triangle on a top face near a corner thereof indicating a direction for the cover to move to the closed position.

11. The ZIF socket in accordance with claim 1, wherein the arc section and the movable and fixed contacting sections are located substantially at the same level.

12. An electrical assembly, comprising:
    a zero insertion force socket, comprising a base defining a number of contact passageways receiving a number of contacts therein, and a cover movably mounted on the base between an open position and a closed position; and
    an IC package mounted on the cover to move therewith, said IC package having a number of pins extending through the cover into the corresponding contact passageways wherein when the cover is at the open position, each pin extends through a space defined within an arc section of the corresponding contact, and when the cover is at the closed position, a movable contacting section of the corresponding contact pushes the pin against a fixed contacting section thereof with a force provided by the arc section, said fixed contacting section connecting with a tail portion of the corresponding contact for being soldered to a printed circuit board.

13. The electrical assembly in accordance with claim 12, wherein said tail portion is located below the corresponding fixed contacting section.

14. The electrical assembly in accordance with the claim 13, wherein each contact has a fitting portion between the fixed contacting section and the tail portion, the fitting portion interferentially engaging with the base.

15. The electrical assembly in accordance with claim 14, wherein the fitting portion has a rectangular configuration with two lateral sides each comprising a barb interferentially engaging with the base.

16. The electrical assembly in accordance with claim 13, wherein the contacts are through-hole type contacts with the tail portions being in line with the fixed contacting section.

17. The electrical assembly in accordance with claim 13, wherein the contacts are BGA type contacts with the tail portion being perpendicular to the fixed contacting section and attached with a solder ball.

18. The electrical assembly in accordance with claim 13, wherein the movable and fixed contacting sections and the arc section are at substantially the same level.

19. The electrical assembly in accordance with claim 13, wherein the socket is substantially rectangular and the cover is movable relative to the base along a diagonal direction of the socket.

20. An electrical assembly, comprising:
    an electrical connector having a rectangular base receiving a number of contacts therein and a cover moveably mounted on the rectangular base, the cover being moveable in a direction diagonal to the base between a closed position and an open position; and an IC package with a number of pins arranged in a matrix and extending into the connector, wherein at the open position each pin does not make contact with the corresponding contact and at the closed position each pin is clamped between a fixed contacting section and a movable contacting section of a contact portion of the corresponding contact which connects with a tail portion for being soldered to a printed circuit board.

21. A socket for use with an IC package, comprising:

a base being of generally a rectangular configuration and defining a number of passageways extending therethrough in a vertical direction;

a number of contacts fixedly received within the corresponding passageways, respectively; and a cover being of generally a rectangular shape and movably mounted to the base, said cover defining a number of holes extending therethrough in the vertical direction corresponding to the passageways, respectively; wherein the cover is moved with regard to the base in a diagonal direction.

22. The socket in accordance with claim 21, wherein one of said base and said cover defines blocks each having an inclined said and the other of said base and said cover defines inclined sections, and both said sides of the blocks and said inclined sections extend parallel to said diagonal direction so that each one of said blocks and each corresponding one of said inclined sections can be slidably engaged with each other in said diagonal direction.

23. The socket in accordance with claim 22, wherein a slot is formed within one of said side of the block and said inclined section, and a tooth is formed on the other of said side of the block and said inclined section, so that said tooth can be movably received within said slot.

24. The socket in accordance with claim 22, wherein a rail is formed on one of said side of the block and said inclined section, and a tooth is formed on the other of said side of the block and said inclined section, so that said tooth can be supportably moved along said rail.

25. The socket in accordance with claim 21, wherein each of the passageways extends horizontally in said diagonal direction.

26. The socket in accordance with claim 25, wherein each of said contacts includes a contact portion defining a fixed contacting section and a moveable contacting portion connected by an arc section, and said moveable contacting section and said fixed contacting section extend along said diagonal direction in said base.

27. An electrical socket assembly comprising:

a socket and a frame both mounted on a PC board;

said socket including:

a base being of substantially a rectangular configuration and defining a number of passageways extending therethrough in a vertical direction for receiving a corresponding number of contacts therein, respectively;

a cover being of generally rectangular shape and movably mounted to the base;

said cover being adapted to be moved with regard to the base in a diagonal direction;

said frame enclosing said socket and defining two cuts at two opposite corners along said diagonal direction; whereby a tool can extend into a corresponding cut to displace the cover relative to the base.

28. The assembly in accordance with claim 27, wherein at least one of two opposite corners of said cover along said diagonal direction extends into one corresponding cut of the frame so that the tool extending into the corresponding cut of the frame can engage said corner of the cover for displacement of the cover relative to the base.

* * * * *